United States Patent [19]

Sampson, III

[11] 4,330,722
[45] May 18, 1982

[54] CLOCKED IGFET LOGIC CIRCUIT

[75] Inventor: George P. Sampson, III, Bernardsville, N.J.

[73] Assignee: Bell Telephone Laboratories, Incorporated, Murray Hill, N.J.

[21] Appl. No.: 178,899

[22] Filed: Aug. 18, 1980

[51] Int. Cl.³ ............... H03K 19/003; H03K 19/096; H03K 19/20
[52] U.S. Cl. .................................. 307/443; 307/452
[58] Field of Search ............... 307/443, 449, 452–453, 307/463, 481, 577, 579, 583

[56] References Cited

U.S. PATENT DOCUMENTS

| | | | |
|---|---|---|---|
| 3,479,523 | 11/1969 | Pleshko | 307/443 |
| 3,551,693 | 12/1970 | Burns et al. | 307/452 X |
| 3,825,888 | 7/1974 | Kawagoe | 307/449 X |
| 3,942,162 | 3/1976 | Buchanan | 307/449 X |
| 3,959,782 | 5/1976 | Dunn | 307/443 X |
| 4,247,921 | 1/1981 | Itoh et al. | 307/463 X |

Primary Examiner—Larry N. Anagnos
Attorney, Agent, or Firm—Arthur J. Torsiglieri

[57] ABSTRACT

A clocked IGFET logic circuit comprises a precharge transistor having its channel connected between a $V_{DD}$ supply terminal and an output terminal, a functional network connected between the output terminal and a switch ground node, the network containing a plurality of transistors each having its gates connected to receive a respective one of a plurality of input signals and its channel connected together with those of the other transistors of the functional network in a configuration which provides the circuit with a predetermined logical function, and a ground switch transistor having its channel connected between the switch ground node and a $V_{SS}$ supply terminal. The gate of the ground switch transistor receives a clock signal which turns that transistor OFF during a precharge phase of the clock signal and ON during an active phase of the clock signal. The gate of the precharge transistor is connected to a precharge generator providing a voltage signal which biases that transistor to have a relatively high channel conductance during the precharge phase and biases that transistor to have a relatively low channel conductance during the active phase. The bias applied to the gate of the precharge transistor is such that the channel conductance of that transistor is sufficient to permit replenishment of charge at the output terminal lost from undesired leakage but not so high as to significantly increase the power dissipation of the circuit. Thus, the disclosed circuit provides stable output states which are characteristic of a static circuit while also having low power dissipation, high performance and low transistor count which are characteristic of a dynamic circuit.

3 Claims, 1 Drawing Figure

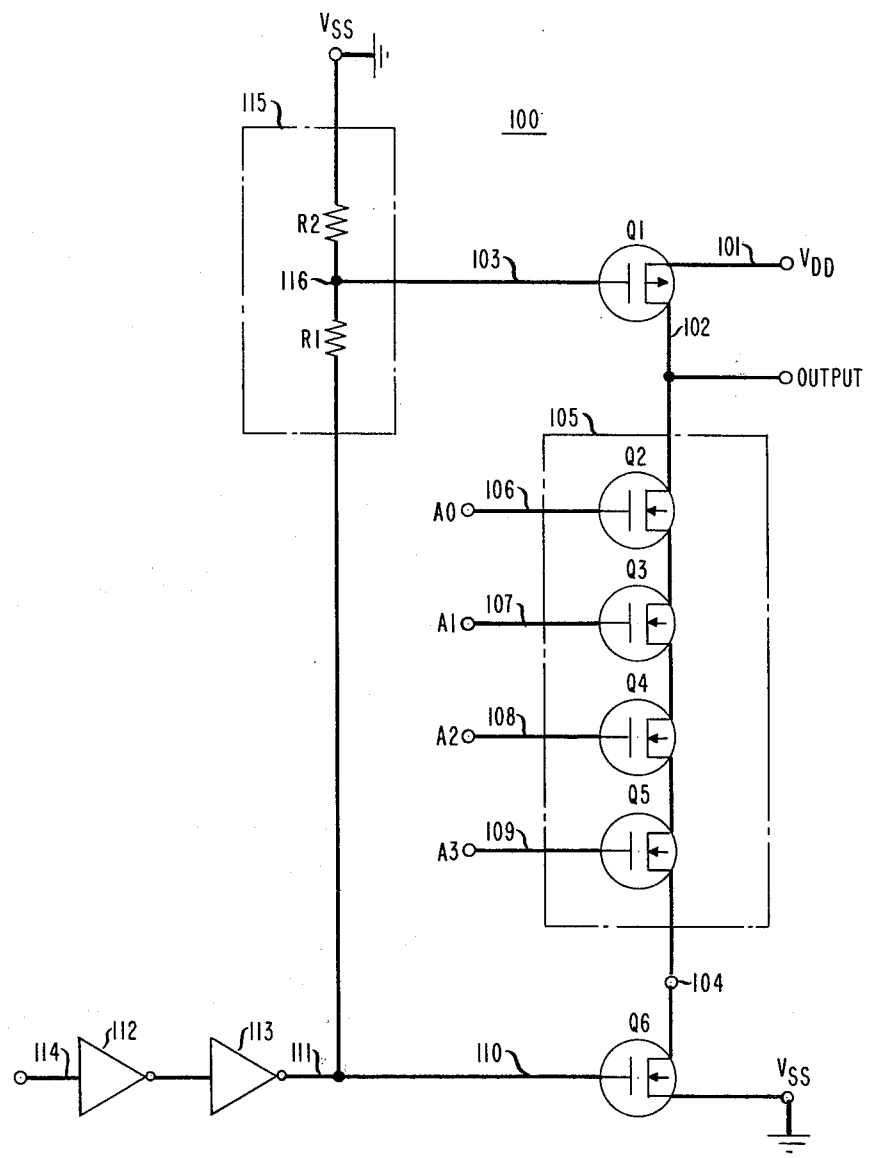

CLOCKED IGFET LOGIC CIRCUIT

BACKGROUND OF THE INVENTION

This invention relates to insulated-gate field-effect transistor (IGFET) logic circuits and more particularly to clocked IGFET logic circuits capable of operating at very slow clock rates.

Clocked IGFET logic circuits which perform predetermined logical functions on a plurality of input signals synchronously with a system or subsystem clock are well known in the art. Generally, clocked IGFET logic circuits are dynamic and have the advantages of low power dissipation, high performance and low device count. A typical example of such a circuit includes a precharge transistor having its conduction channel connected between a $V_{DD}$ supply terminal and an output terminal, a functional network connected between the output terminal and a switch ground node, and a ground switch transistor having a conduction channel connected between the switch ground node and a $V_{SS}$ supply terminal. The functional network includes a plurality of transistors each having a gate connected to a respective one of a plurality of input signals and a conduction channel which is connected together with those of the other transistors of the functional network in a configuration which provides the circuit with the predetermined logical function. The gates of the precharge transistor and the switch ground transistor both receive control signals which are synchronous with the clock.

During a precharge phase of the clock the precharge transistor is turned ON while the ground switch transistor is turned OFF, and the output terminal is held at $V_{DD}$ potential which is a logic "1" level. During an active phase of the clock the precharge transistor is turned OFF while the switch ground transistor is turned ON, and the output terminal manifests a logic level which is a function of the state of the input signals. Because the precharge transistor is turned OFF, a logic "1" level at the output terminal during the active phase is maintained by the charge which is stored on the parasitic and load capacitances at that terminal. However, owing to the various charge loss mechanisms which are present at the output terminal, such as reverse pn-junction leakage at source and drain junctions and charge sharing, the stored charge diminishes with time causing the logic "1" level to decay toward a logic "0" level while the precharge transistor remains OFF. Therefore, dynamic clocked IGFET logic circuits have the problem of decaying output states which imposes a limitation on the maximum duration of the active phase of the clock.

A prior art solution to the problem of decaying output states is to provide the output terminal of a dynamic circuit with a sustaining device such as a large resistance connected between the output terminal and the $V_{DD}$ supply terminal for conducting a small current from the $V_{DD}$ supply to the output terminal to replenish charge lost through leakage and thereby maintain a stable logic "1" level. However, this prior art solution is deficient in that it requires the addition of an extra element to each circuit causing an undesirable increase in the layout area of the circuit. Furthermore, the prior art solution also increases the parasitic capacitance at the output terminal of each circuit causing an undesirable slowing of switching speed of the circuit.

Therefore, a need clearly exists for a clocked IGFET logic circuit which provides stable output states and which has power dissipation, device count, and performance comparable to that of the dynamic circuit.

SUMMARY OF THE INVENTION

Accordingly, the above and other deficiencies of the prior art are ameliorated by the present invention which is a clocked logic circuit for providing during a first phase of a clock signal an output signal which is a predetermined logical function of the state of a plurality of input signals and for providing during a second phase of the clock signal an output signal at a first logic level. The circuit comprises: means for providing the clock signal; first and second terminals respectively adapted to receive a first and a second operating potential; a plurality of input terminals adapted to receive respective input signals; an output terminal for providing the output signal; a first IGFET having a conduction channel coupled between the first terminal and the output terminal and a gate electrode; a functional network coupled between the output terminal and a first node, and means coupling the first node to the second terminal. The functional network comprises a plurality of IGFETs each having a gate electrode coupled to a respective one of the input terminals and a conduction channel, the conduction channels of the IGFETs of the functional network being coupled in a configuration to provide the circuit with the predetermined logical function. The circuit is characterized in that there are included means coupled to the gate electrode of the first IGFET responsive to the clock signal for providing during the second phase of the clock signal a first potential level to bias the first IGFET to have a relatively high channel conductance and for providing during the first phase of the clock signal a second potential level to bias the first IGFET to have a relatively low channel conductance but sufficient to permit replenishment of charge at the output terminal lost through undesired leakage.

BRIEF DESCRIPTION OF THE DRAWING

FIG. 1 is a schematic diagram of a clocked 4-input NAND gate circuit implemented in complementary metal-oxide-semiconductor technology (CMOS) according to one embodiment of the present invention.

DETAILED DESCRIPTION

Referring now to FIG. 1 there is shown a schematic diagram of a clocked logic circuit 100 according to one embodiment of the present invention. The circuit is implemented in CMOS technology and operates between a positive $V_{DD}$ supply potential and a $V_{SS}$ supply potential which in the present embodiment is ground. The supply potentials are applied to the circuit through a $V_{DD}$ supply terminal and a $V_{SS}$ supply terminal, respectively. A p-channel precharge transistor Q1 has its source electrode 101 connected to the $V_{DD}$ supply terminal and its drain electrode 102 connected to an OUTPUT terminal. Since IGFETs are in general bilateral devices the distinction between source and drain electrodes is not essential to the description of the circuit and transistor Q1 can be described simply as having a conduction channel connected between the $V_{DD}$ and OUTPUT terminals. As is well known, the electrical conductance of the channel of an IGFET is controlled by the bias potential applied to the gate of the transistor and can be varied from a relatively high value when the transistor is driven into its ON state to a vanishingly small value when the transistor is driven into its OFF state. The absolute channel conductance of an IGFET in the ON state depends upon its transconductance and the bias potential level applied to its gate electrode.

Connected between the OUTPUT terminal and a switch ground node 104 is a functional network 105 containing four n-channel transistors Q2, Q3, Q4, and Q5 having their conduction channels connected in series and their gates each connected to a respective one of four INPUT terminals 106 through 109. The series connection of the conduction channels of the transistors of the functional network provides the circuit with the NAND logical function performed on four input signals A0, A1, A2 and A3 received at the input terminals.

The switch ground node 104 is coupled to the $V_{SS}$ supply terminal through an n-channel ground switch transistor Q6. The gate of Q6 receives a buffered clock signal from a clock driver circuit comprising two inverter stages 112 and 113. The clock driver circuit receives a system or subsystem clock signal at its input terminal 114 and provides at its output terminal 111 a buffered clock signal having appropriate CMOS logic levels and a relatively high current drive sufficient to permit a large fanout to many logic circuits. Typical logic levels for CMOS are $V_{DD}$ for a logic "1" and $V_{SS}$ for a logic "0".

If the circuit of FIG. 1 were to be operated as a dynamic circuit according to the prior art, the gate 103 of the precharge transistor Q1 would also be connected to the output terminal 111 of the clock driver circuit. In that case when the clock signal is at a logic "0" level, the circuit is in a precharge phase with transistor Q1 turned ON and transistor Q6 turned OFF, and the OUTPUT terminal is pulled to the logic "1" level of $V_{DD}$ through transistor Q1. Referring again to the case of a dynamic circuit, when the clock signal is at a logic "1" level, the circuit is in an active phase with transistor Q1 turned OFF and transistor Q6 turned ON. Under these conditions, the logic level at the OUTPUT terminal is a NAND function of the state of the input signals A0 through A3. For example, if input signals A0 through A3 were all at the logic "1" level during the active phase, transistors Q2 through Q5 would all be turned ON creating a current path between the OUTPUT terminal and the switch ground and causing the OUTPUT terminal to be pulled to the logic "0" level of $V_{SS}$ through transistor Q6. For all other states of the input signals A0 through A3 there would be no current path through the functional network and the OUTPUT terminal would be maintained at the logic "1" level by the charge stored in the parasitic and load capacitances (not shown) at that terminal.

It is well known that various current leakage mechanisms exist in MOS transistors such as reverse pn-junction leakage currents associated with the source and drain junctions of such transistors. Such leakage currents and charge sharing in the functional network can cause the charge stored at the OUTPUT terminal of the dynamic circuit to be drained away and a logic "1" level at that terminal to decay towards a logic "0" level. The leakage current affecting stored charge in dynamic logic circuits in typical MOS integrated circuits is on the order of hundreds of nanoamperes. A leakage current of such a magnitude limits the charge storage time to be on the order of microseconds. Therefore, the maximum duration of the active phase of such dynamic circuits is limited to be on the order of microseconds.

For many applications such as in address decoder circuits of static semiconductor memories and in microcomputers this limitation on the duration of the active phase of the circuit is undesirable.

According to the embodiment shown in FIG. 1, the gate of the precharge transistor is connected to a tap terminal 116 of a voltage divider chain 115 connected between the output terminal of the clock driver circuit and the $V_{SS}$ supply terminal. The voltage divider chain comprises a resistance R1 connected between the clock driver circuit and the tap terminal and another resistance R2 between the tap terminal and the $V_{SS}$ supply terminal. During the precharge phase of the clock when the output terminal of the clock driver circuit is at $V_{SS}$ potential, virtually no current flows through the divider chain and the tap terminal provides $V_{SS}$ to bias the precharge transistor Q1 to its full ON state. However, during the active phase of the clock when the output of the clock driver circuit is at $V_{DD}$ potential, the precharge transistor is not turned OFF as in the dynamic circuit, but rather the tap terminal provides a potential which biases the precharge transistor to have a relatively low but nonvanishing channel conductance.

The purpose of the low channel conductance of the precharge transistor during the active phase is to permit a small current to flow from the $V_{DD}$ supply to the OUTPUT terminal to replenish the charge at the OUTPUT terminal lost through undesired leakage. Thus, the circuit configuration of FIG. 1 provides a clocked logic circuit having a stable logic "1" level while substantially retaining the advantages of a dynamic logic circuit.

Because the voltage divider chain provides the bias potential for the precharge transistors of many circuits, the additional layout area of the divider chain is shared by many circuits and the total layout area of an integrated circuit which uses clocked logic circuits according to the present invention would not be significantly greater than one which uses dynamic logic circuits according to the prior art.

The bias potential level on the gate of transistor Q1 during the active phase is fixed by the ratio of the resistance R1 to the resistance R2. In order to avoid any unnecessary increase in power dissipation of the circuit over that of the dynamic circuit, the bias potential should be such that the current supplied to the OUTPUT terminal just offsets the leakage current at that terminal, i.e., on the order of hundreds of nanoamperes. Therefore, the preferred value for the resistance ratio to offset leakage without significantly increasing the power dissipation of the circuit will depend upon parameters such as the magnitude of the leakage current, the power supply voltage, and the transconductance of the precharge transistor. The determination of the preferred value of the resistance ratio from those parameters would be obvious to one skilled in the art of IGFET circuit design.

Although the disclosed embodiment of the present invention uses circuitry having a voltage divider chain for providing appropriate bias potential levels to the gate of the precharge transistor for the precharge and active phases, other types of circuitry for providing the appropriate bias potential levels may be substituted by one skilled in the art.

Although the disclosed embodiment of the present invention is implemented in CMOS, clocked logic circuits according to the present invention may also be implemented in other IGFET technologies such as p-channel metal-oxide-semiconductor technology (PMOS) and n-channel metal-oxide-semiconductor technology (NMOS) with appropriate modifications to the polarities and magnitudes of the supply potentials, bias potential levels and logic levels as would be obvious to one skilled in the art of IGFET circuit design.

It will be understood by those skilled in the art that the foregoing and other modifications and alterations may be made to the described embodiment without departing from the spirit and scope of the present invention. For example, the transistors of the functional network may have their conduction channels connected in a configuration which provide the circuit with another logical function instead of the NAND function; the switch ground node may be connected directly to the $V_{SS}$ supply terminal rather than through a ground switch transistor if provisions are made to insure that there are no current paths through the functional network during the precharge phase; and the voltage divider chain may be formed with other elements such as diodes and transistors instead of resistors.

I claim:

1. A clocked logic circuit for providing during a first phase of a clock signal an output signal which is a predetermined logical function of the state of a plurality of input signals and for providing during a second phase of the clock signal an output signal at a first logic level, the circuit comprising:
    means for providing the clock signal;
    first and second terminals respectively adapted to receive a first and a second operating potential;
    a plurality of input terminals adapted to receive respective input signals;
    an output terminal for providing the output signal;
    a first IGFET having a conduction channel coupled between the first terminal and the output terminal and a gate electrode;
    a functional network coupled between the output terminal and a first node, the network comprising a plurality of IGFETs each having a gate electrode coupled to a respective one of the input terminals and a conduction channel, the conduction channels of the IGFETs of the functional network being coupled in a configuration to provide the circuit with the predetermined logical function;
    means coupling the first node to the second terminal;
    characterized in that there are included means coupled to the gate electrode of the first IGFET responsive to the clock signal for providing during the second phase of the clock signal a first potential level to bias the first IGFET to have a relatively high channel conductance and for providing during the first phase of the clock signal a second potential level to bias the first IGFET to have a relatively low channel conductance but sufficient to permit replenishment of charge at the output terminal lost through undesired leakage.

2. A clocked logic circuit as recited in claim 1 wherein the first IGFET is of a first channel conductivity type, the plurality of transistors of the functional network are of a second channel conductivity type, the means for providing the clock signal includes a clock driver circuit having an input terminal adapted to be coupled to a source of the clock signal and an output terminal at which is provided the clock signal having the first logic level during the first phase and a second logic level during the second phase, the means for coupling the first node to the second terminal includes a second IGFET of the second channel conductivity type having its conduction channel coupled between the first node and the second terminal and its gate coupled to the output terminal of the clock driver circuit and further characterized in that the means coupled to the gate electrode of the first IGFET comprise a voltage divider chain coupled between the output terminal of the driver circuit and the second terminal and having a tap terminal coupled to the gate electrode of the first IGFET.

3. A clocked logic circuit as recited in claim 2 further characterized in that the voltage divider chain comprises a first resistance coupled between the output terminal of the driver circuit and the tap terminal and a second resistance coupled between the tap terminal and the second terminal, the ratio of the first resistance to the second resistance having a value which causes the tap terminal to have the second potential level during the first phase of the clock signal.

* * * * *